United States Patent
Cadet

(10) Patent No.: US 6,559,409 B1
(45) Date of Patent: May 6, 2003

(54) METHOD FOR MARKING INTEGRATED CIRCUITS WITH A LASER

(75) Inventor: Bernard Cadet, Rousset (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 1262 days.

(21) Appl. No.: 08/567,950

(22) Filed: Dec. 6, 1995

(30) Foreign Application Priority Data

Dec. 9, 1994 (FR) .............................. 94 15151

(51) Int. Cl.⁷ .............................................. B23K 26/00
(52) U.S. Cl. .................................................. 219/121.68
(58) Field of Search ....................... 219/121.65, 121.66, 219/121.68, 121.69, 121.73, 121.85; 437/173; 347/224

(56) References Cited

U.S. PATENT DOCUMENTS

| | | | | |
|---|---|---|---|---|
| 4,166,574 A | * | 9/1979 | Yokoyama | 235/464 |
| 4,344,064 A | * | 8/1982 | Bitler et al. | 338/334 |
| 4,510,673 A | * | 4/1985 | Shils et al. | 437/209 |
| 4,522,656 A | | 6/1985 | Kuhn-Kuhnenfeld et al. | |
| 4,585,931 A | * | 4/1986 | Duncan et al. | 235/464 |
| 4,945,204 A | | 7/1990 | Nakamura et al. | 219/121.6 |
| 5,175,425 A | * | 12/1992 | Spratte et al. | 235/464 |
| 5,294,812 A | * | 3/1994 | Hashimoto et al. | 257/65 |
| 5,329,090 A | * | 7/1994 | Woelki et al. | 219/121.68 |

FOREIGN PATENT DOCUMENTS

| | | | |
|---|---|---|---|
| GB | A-2 262 839 | | 6/1993 |
| JP | 57-102038 | * | 6/1982 |
| JP | 59-110129 | * | 6/1984 |
| JP | 59-172622 | * | 9/1984 |
| JP | 60-31246 | * | 2/1985 |
| JP | 63-73535 | * | 4/1988 |
| JP | 63-237431 | * | 10/1988 |
| JP | 2-158144 | * | 6/1990 |
| JP | 3-237738 | * | 10/1991 |
| JP | 9-98847 | * | 3/1992 |

OTHER PUBLICATIONS

French Search Report from French Patent Application 94 15151, filed Dec. 9, 1994.
Patent Abstracts of Japan, vol. 16, No. 224 (E–1206) May 25, 1992 & JP–A–04 039 947 (Mitsubishi).

* cited by examiner

Primary Examiner—Samuel M. Heinrich
(74) Attorney, Agent, or Firm—Wolf, Greenfield & Sacks, P.C.; James H. Morris

(57) ABSTRACT

A method for physically marking, on silicon wafers, of integrated circuits deemed to be defective during a testing step, so as to modify the visual appearance of the surface of these circuits, wherein the marking is done by the exposure of the circuits to a laser beam. The disclosure also relates to an instrument enabling the method to be implemented.

14 Claims, 1 Drawing Sheet

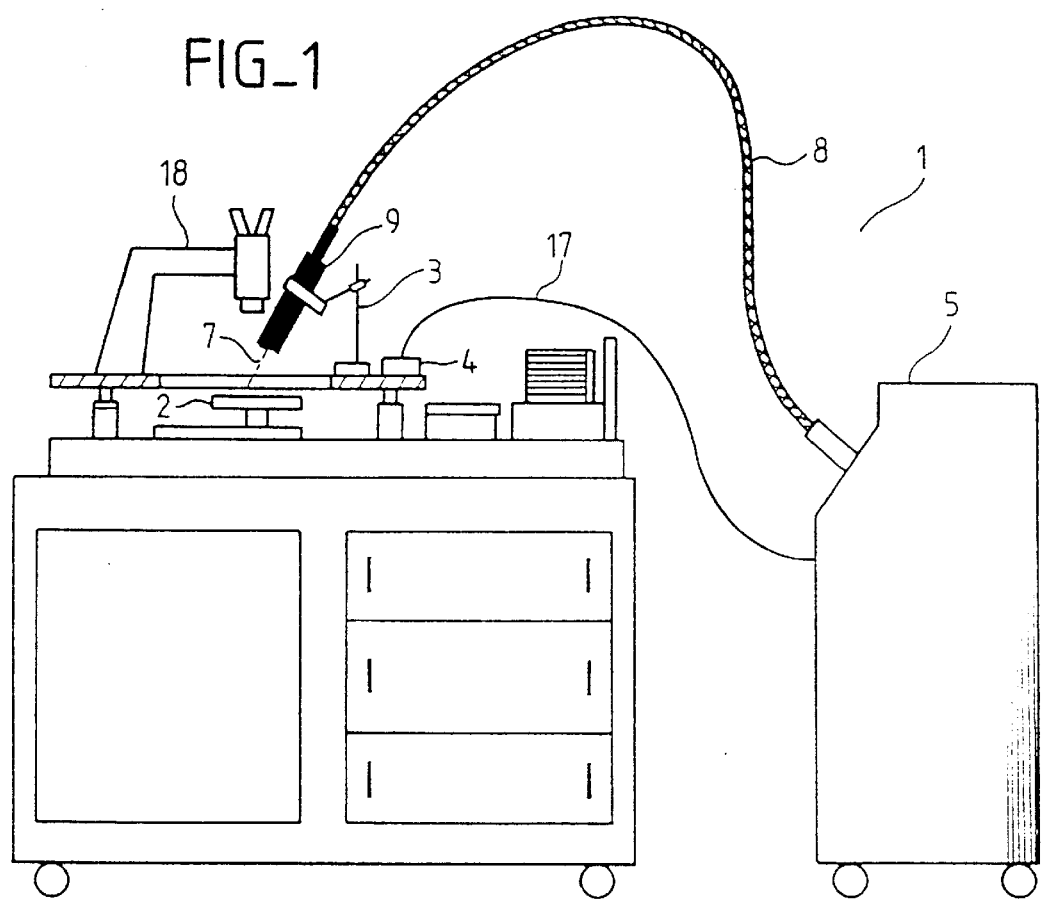
FIG_1
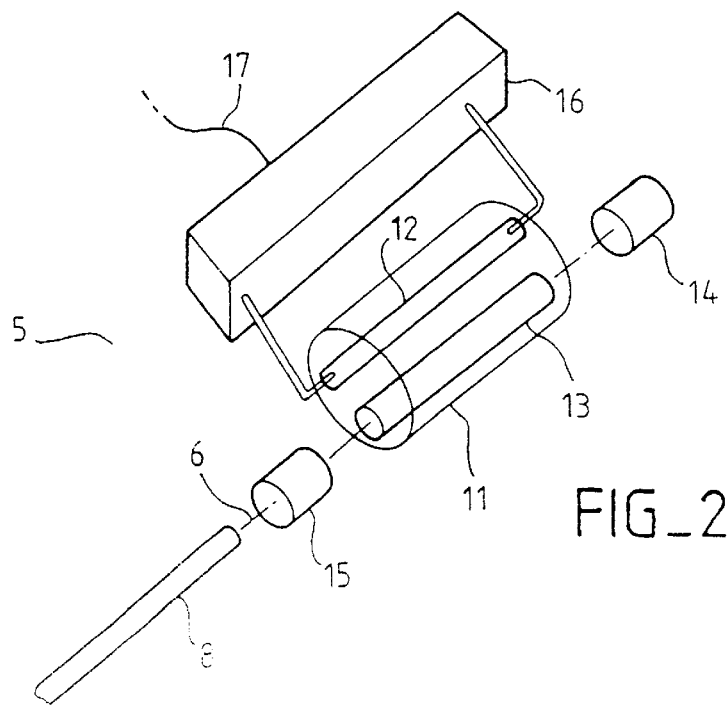
FIG_2

METHOD FOR MARKING INTEGRATED CIRCUITS WITH A LASER

BACKGROUND OF THE INVENTION

1. Field of the Invention

The invention relates to a method for the marking integrated circuits with a laser, and to an instrument pertaining thereto. Such a method enables the physical marking of circuits deemed to be defective during a testing step, so that these circuits can be optically identified, and discarded during subsequent encapsulation steps.

2. Discussion of the Related Art

The manufacture of integrated circuits comprises several steps.

First of all, the integrated circuits proper are physically made out of a silicon wafer by the methods of doping, metallization and deposition of a passivation layer (made of nitride, oxide or polysilicon oxide). These methods are well known to those skilled in the art.

Typically, a silicon wafer has a diameter of some tens of centimeters. On a wafer, a variable number of identical circuits is made, the number of circuits depending on the relative surface area of these circuits in relation to the surface area of the wafer.

Then, these circuits are generally tested by a testing machine known as a wafer prober. The principle of the test is to bring metal tips into contact with the circuit (typically at the soldering pins of wires of the circuit). By enforcing and/or measuring electrical signals pertaining to planned functional characteristics of the circuit, it is possible to compare the functioning of the circuit with a functioning deemed to be satisfactory for all these characteristics. For example, tests will be performed on the voltage produced by an internal supply, consumption, the reaction of the circuit to control signals (if, for example, the circuit must perform a program memorized in the circuit), reaction time, etc.

Once the tests have been carried out, the silicon wafer is cut out in order to individualize the circuits and these circuits are encapsulated, i.e. they are packaged.

If the testing of at least one characteristic reveals a form of behavior on the part of the circuit that is not acceptable in terms of the characteristics guaranteed by the manufacturer, this circuit must be removed, after the cutting-out stage, from the manufacturing line so that it is not subsequently packaged and used in an application.

To do this, the circuit is physically marked, i.e. its external appearance is modified so that it can be subsequently recognized as being defective. The recognition is done optically by an instrument.

Conventionally, the marking is done through the deposition, by pneumatic spraying or by capillarity, of a drop of ink on the surface of the circuit, on the surface passivation layer.

This marking may be done as and when the circuits of a wafer are tested, the end of the inking device (called an inking head) being positioned between the tips of the wafer prober. The marking can also be done once all the circuits have been tested, either by the same instrument or by another instrument (using what is known as deferred inking). Since the dimensions of the circuits are tending to become ever smaller, there is a growing trend towards the use of deferred inking. In this case, the procedure uses one or more instruments exclusively dedicated to the testing of the wafers and one or more devices exclusively dedicated to the marking of those circuits of the wafers tested that are deemed to be defective. Conventionally, it is sought to use an opaque ink (black for example), the wafer being of a silvery or yellowish color.

This method has a certain number of drawbacks:

It gives rise to ink spots that are not reproducible identically. A certain degree of variation is seen in the characteristics of the ink spots. The diameter and shape of the ink spots varies as a function of extent to which the inking device brought into use (the number of spots to be made varies according to the silicon wafer). Now, the automatic machines that select the circuits in order to discard them after the cutting-out operation identify each circuit by the morphology of the ink spot, namely its diameter and shape (and not only by the presence of ink). Typically, to mark circuits having a surface area of about one square millimeter for a desired ink spot diameter of 600 microns, variations in the range of plus/minus 200 microns are observed. If the spots are too small or badly shaped, a fresh drop of ink has to be deposited by means of a manual inking device activated by an operator. This may substantially slow down the productivity of a manufacturing line.

The presence of smudges. It may happen that the ink spot spreads beyond the surface occupied by the circuit and that the ink comes into contact with neighboring circuits or with testing tips (if the test and the inking are done by one and the same instrument). This may necessitate human action or may disturb the progress of the test by introducing parasitic signals. The presence of smudges may thus induce the marking of circuits that would not have been deemed to be defective had there been no smudges.

The deposition of ink on the platform supporting the wafer during the tests, especially during the marking of circuits located on the periphery of the silicon wafer. Now, this platform is a metal platform providing for electrical continuity on the real surface of the wafer, and forming a ground plane. It is therefore necessary for an operator to remove this ink before positioning the next wafer on the platform. This gives rise to additional loss of time.

An object of the invention is to overcome at least these drawbacks.

SUMMARY OF THE INVENTION

Thus, the invention provides a method for the physical marking, on a silicon wafer, of integrated circuits deemed to be defective during a testing step so as to modify the visual appearance of the surface of these circuits, wherein the marking is done by the exposure of a surface of the circuits to a laser radiation.

The invention therefore brings about variations in the appearance of the surface of the defective circuits by the heating of this surface instead of by the deposition of a layer of ink.

Unlike the process of ink marking, laser marking provides for very high directivity of marking owing to the spatial cohesion of the laser radiation.

It is therefore possible:

to greatly reduce the variations in diameter of marking and reduce them, for example, from approximately 200 microns (with ink) to approximately 10 microns, eliminate the risk of smudging and of marking the platform that supports the wafer.

This cohesion furthermore makes it possible to obtain a high concentration of energy per unit of surface area.

In a preferred embodiment, the circuits being covered with at least one passivation layer, the surface layers of the circuits deemed to be defective are made to melt on a depth greater than the thickness of this passivation layer.

Ink marking does not modify the structure of the circuits deemed to be defective. Ink forms a layer that is simply deposited and therefore gets superimposed on the other layers of the circuit. Owing to the risk of smudging, an ink that does not chemically modify the circuit is chosen. It is seen to it, inter alia, that the ink does not contain sodium.

During the laser marking, the change in the appearance of the surface of a circuit is obtained by the heating and melting of one or more surface layers of the circuit. The surface of the circuit will then typically have a brownish color that can be identified optically.

Owing to the great spatial cohesion of laser radiation, the marking could be destructive, i.e., the circuit could be modified so as to make it inoperative. For this purpose, it is enough to use a level of laser power and an exposure time of the surface of the circuit that are sufficient to obtain a melting of one or more active layers, located beneath the passivation layer (with a typical thickness of about 1 to 2 microns). The term "active layer" is understood to mean a layer that participates in the electrical operation of the circuit. A passivation layer is a mechanical protection layer and is independent of the function of a circuit.

Laser marking makes it possible to obtain a very small surface area of marking, owing to the very great directivity of the laser radiation. This is why, in an alternative version, the defective chip is marked at several places, for example with a geometrical figure.

Since ink marking is not destructive, it may happen that a circuit deemed to be defective is capable of working normally. Indeed, the testing of the circuits relates not only to their capacity to function or not function, but also to whether the relative operating capacities are as specified or not. Thus, for example, it is sought to ensure that the circuit has a certain lifetime in terms of operation, a maximum level of consumption, etc. A circuit could therefore be capable of fulfilling a given function but may otherwise be deemed to be defective. Consequently if, by mischance, this circuit is not recognized as being defective, and is therefore subjected to encapsulation, it might be used and its defects will appear only belatedly. Nor is it possible to rule out the risk of the fraudulent use of these circuits if they are not destroyed.

This quality of the marking wherein it may, if necessary, be destructive is especially useful in the context of the manufacture of circuits intended for applications of a sensitive nature, in terms of:

use (for example in banking applications as regards, inter alia, the risk of fraud) as well as of the assurance of a given guarantee (applications in systems of security in the broad sense of the term, pertaining to goods and/or persons, or in inaccessible systems, such as satellites, for example).

The invention therefore is not limited to resolving technical problems pertaining to the use of ink but procures a novel and particularly important characteristic.

The invention also relates to an instrument for the marking of integrated circuits comprising a platform to receive a silicon wafer, mechanical means to position an end of a marking device in the vicinity of the platform, wherein the marking device comprises a laser in order to produce a laser beam and an optical interface to bring at least a fraction of this laser beam into contact with the surface of the integrated circuits.

Such an instrument enables the implementation of the laser marking method.

BRIEF DESCRIPTION OF THE DRAWING

Other special features shall appear from the following detailed description of an exemplary embodiment of a testing machine implementing the invention, made with reference to the appended drawings of which:

FIG. 1 gives a schematic view of a marking instrument enabling the implementation of the invention; and FIG. 2 shows a laser of the marking instrument.

DETAILED DESCRIPTION

FIG. 1 shows a marking instrument 1.

This instrument 1 comprises:

a horizontal platform 2 to receive silicon wafers after the making of integrated circuits on these wafers, mechanical means, represented in the form of an upright stand 3, to position an end of a marking device in the vicinity of the platform 2, a control circuit 4.

The marking device comprises:

a laser 5 in order to produce a laser beam 6, and an optical interface to bring at least a fraction of the laser beam produced into contact with the surface of the integrated circuits.

The optical interface comprises:

a transmission medium, herein an optical fiber 8 comprising an input and an output, the input being placed at output of the laser 5 so that the laser beam 6 produced by the laser 5 is channelled into the transmission medium;

a collimation device 9, placed between the output of the optical fiber 8 and the platform 2 to produce a laser beam 7 derived from the laser beam 6.

Conventionally, the collimation device 9 will have a fixed position during the marking of the circuits of a wafer, and the platform 2 will be shifted transversally to bring the integrated circuits deemed to be defective into contact with the laser beam 7.

To make this instrument 1, it is possible to adapt a conventional marking instrument, such as for example the instrument LSW 4000 manufactured by the firm Baasel. Indeed, apart from the fact that the marking "agent" is different, the related mechanical devices (platform, stand, platform translation means, etc.) and their control means will not be different from those of a conventional marking instrument, the desired function being identical.

While it is possible to envisage the devising of an instrument that carries out tests as well as the marking of the circuits to be tested, the instrument used in practice will be an instrument specifically dedicated to marking, for the following reasons:

if it is desired to have the ability to mark circuits with a very small surface area, in the range of one millimeter square for example, it will be difficult or even impossible to position the end of the marking device between or beside the tips of the test probe, the devising of distinct instruments for the marking and the testing does away with problems of interference and management of operation between the two functions, if an instrument undergoes dysfunctioning and has to be stopped for repairs, only one operation, for testing or for marking, will be suspended, since the period of marking of a circuit is generally far shorter (some milliseconds) than the period of the tests (which could go up to several tens of seconds), it is possible firstly to use only one marking instrument for several testing instruments and, secondly, to use already existing testing instruments without having to change them or modify them in order to receive the laser.

According to an alternative embodiment, the platform on which the silicon wafer lies is fixed. To carry out the marking of the defective chips, the optical interface is shifted.

FIG. 2 shows an exemplary embodiment of the laser 5 of FIG. 1.

The laser used will, for example, be a YAG (Yttrium Aluminium Garnet) type of solid laser. YAG is a crystalline material. It is a neodyme-doped yttrium and aluminium garnet. Its wavelength therefore is 1060 nanometers, as in the case of neodyme glass.

The main advantages of the YAG lie in its low threshold, enabling optical pumping by a continuous emission source, high output and a degree of thermal conductivity appreciably greater than that of glass. These qualities make it possible, in pulsed operation, to obtain a rate of emission far higher than that of the other solid materials (such as ruby or neodyme glass). Indeed, the heating of the laser bar leads to temperature gradients that modify its geometrical and optical qualities and may even prohibit any oscillation. The improvement of the efficiency and of cooling therefore represents an essential factor for increasing the rate of the pulses.

As regards the pumping source, the YAG laser allows the use of continuous-wave or pulsed pumping.

In pulsed pumping, the pumping source is a flash lamp. For example, a krypton lamp will be used. The flash should be pre-ionized at the start of the pulse, for example by a high voltage. The operating voltage of the lamp is in the range of some hundreds of volts, depending of course on the discharge length.

The laser 5 shown in FIG. 2 comprises:
a laser cavity 11 comprising a lamp 12 and a YAG bar 13,
on either side of the cavity 11, two mirrors 14 and 15 positioned in the axis of the bar 13,
an electrical supply circuit 16 to supply the lamp 12.

Typically, the electrical supply of the lamp 12 is obtained by the sudden discharge of a capacitor charged beforehand at a desired voltage. The supply circuit 16 therefore essentially comprises a voltage converter circuit, a load circuit and a control circuit. This supply circuit will be connected to the control circuit 4, which will activate the discharge by communication means 17.

The input of the optical fiber 8 is located in the immediate vicinity of the cavity 11, in the axis of the bar 13.

The mirror 14 is a reflective type of mirror. The mirror 15 is a semi-reflective type, and is placed between the bar 13 and the input of the optical fiber 8. The laser beam 6 is obtained by tapping a part of the laser radiation present in the cavity 11. The beam 6 is guided by means of the optical fiber 8 up to the collimation device 9.

This collimation device 9 will comprise, for example, a convergent lens to focus the beam 6 if it is desired to mark circuits with a surface area smaller than the diameter of the beam 6.

It is also possible to provide for modifying the marking diameter of the circuits by modifying the position of the wafer with respect to the focal plane of the lens:
either by providing for means to shift this convergent lens in the collimation device 9,
or by modifying the relative positions of the platform 2 and of the collimation device 9, which is more complicated from the control point of view. Indeed, it would then be necessary to take account of these relative positions in the system for activating the horizontal shift of the platform 2 to be certain that the circuits marked correspond to those deemed to be defective during the testing step. It is possible, for example, to modify the position of the platform 2 by shifting it vertically by translation, the collimation device 9 remaining fixed. It is also possible to modify the position of the collimation device 9 by shifting it vertically, along the stand 3, the platform remaining in a fixed position in the vertical plane. It is also possible to provide for modifying the positions of both the platform 2 and the collimation device 9.

Preferably, the vertical translation of the platform 2 will be used in order to minimize the operations for the mechanical adjustment of the position of the collimation device which require high precision. No detailed structural description shall be given herein of the means for the vertical and horizontal translation of the platform. Such means are used in conventional inking instruments and are therefore known to those skilled in the art.

In order to ascertain that the marking diameters have the desired value and that the marking is centered with respect to the integrated circuits, the instrument 1 will conventionally have a microscope 18 positioned above the platform 2.

In the exemplary embodiment described, the collimation device has been positioned in a slightly slanted position. Hence, potato-shaped marks will be formed. It is quite possible to integrate the collimation device and the microscope into one and the same structure if circular marks are to be made, the derived laser beam being then directed vertically.

In pulsed pumping, given the usual small sizes of YAG bars, the energy per pulse is in the range of some hundreds of millijoules in Q-switched laser operation.

The rate of the pulsed lasers pumped by flash devices is limited by the de-ionization time of the pumping source. However, since the YAG may be pumped continuously, it is possible, if necessary, to provide it with a rotating prism or electro-optical type of switching device and thus obtain a high repetition rate Q-switch pulsed laser operation. The peak energy or peak power per pulse will, however, be notably weaker than in the case of pulsed pumping which has higher power.

As regards the functional characteristics, it is possible to take for example:
a cylindrical bar 13 with a diameter of 4 millimeters and a length of some centimeters,
a krypton lamp 12.

Thus, a laser beam 6 is obtained with a wavelength of 1060 nanometers and a diameter of 4 millimeters.

To implement the method according to the invention, the following procedure is used:
the automatic positioning of a silicon wafer on the platform 2 after the testing of these circuits by an appropriate instrument,
the performance of the marking by the successive conveying, through the shifting of the platform 2, of the circuits previously deemed to be defective into the axis of the collimation device 9 and, by the triggering, for each circuit deemed to be defective, of exposure to the laser beam 7 in order to obtain the melting of at least a part of one or more surface layers.

If it is desired that the marking should be functionally destructive, the surface layers of the circuits deemed to be defective are made to melt to a depth greater than the thickness of the passivation layer or layers, if they exist.

As already practiced conventionally, the testing instruments supply a computer file comprising the coordinates of the circuits deemed to be defective, in a defined plane reference system. The identification of the circuits will be done conventionally according to a reference point and perpendicular axes. It will be noted that it is possible to physically determine an original point of reference by carrying out the laser marking of one of the circuits of the wafer before the testing step.

The cooperation between the testing instruments and the marking instruments is not described in greater detail. This cooperation is similar to what is already being done when using the method of deferred ink marking. Only the marking device is different.

The period of time for which the surface of a circuit is exposed to the laser beam in order to carry out the marking is about some milliseconds. Of course, it will depend on the power implemented and the number of surface layers that are to be melted. The greater the energy of the beam, the shorter will be the period of exposure for an equivalent marking.

The power or energy of the laser will depend on the technology of manufacture of the circuits and more particularly on the nature and thickness of the passivation layer.

Let us consider, for example, the following assumptions:

a nitride oxide passivation layer, a thickness of 1 to 2 microns for the passivation layer, a marking diameter of 500 microns (a spot of 0.785 square millimeters), melting on a depth equal to the thickness of the passivation layer (non-destructive marking), exposure time of three milliseconds to the derived laser beam 7.

An energy value of 360 millijoules per square millimeter enables this result to be obtained.

If it is assumed that:

the mirror 15 has a transmission coefficient of 20%, the attenuation in the optic fiber is 0.7 dB (from the viewpoint of energy, the laser beam 7 corresponds to a fraction of the laser beam 6, owing to losses between the input of the optic fiber 8 and the output of the collimation device 9).

Then, the following will be chosen:

a derived laser beam 7 having an energy value of approximately 280 millijoules, a laser beam 6 having an energy value of approximately 330 millijoules, an output beam from the resonant cavity 11 having an energy value of approximately 1.6 joules.

According to these assumptions, the energy at the surface of the integrated circuits will be 1 joule per square millimeter if the marking diameter is 300 microns and 280 millijoules per square millimeter if the marking diameter is 1000 microns.

The nominal power of the laser will be set by the nature of the surface layers and by the maximum melting depth envisaged.

In the example described here above, an energy level of 280 millijoules per square millimeter will have to be enough to cause a melting of the passivation layer.

If the marking diameter is smaller, the time of exposure to the beam 7 could be reduced in order to have an identical melting depth. It is also possible, in this same example, to keep an identical exposure time and change the lens 15 to reduce the transmission coefficient of this lens.

Depending on the nature of the surface layers of the circuits, for marking diameters that vary from 300 to 1000 microns and assuming that the exposure time is in the range of 1 millisecond, the surfaces of the circuits will be exposed to radiation such that the energy values at the surfaces of the circuits are in the range of 200 to 1200 millijoules per square millimeter, or even more.

Of course, to appreciate the total amount of time taken to mark the circuit, it is necessary to take account of the laser recharging time between two successive exposures. On the whole, following the above-mentioned assumptions, the marking of a circuit will last about 100 milliseconds.

In a conventional inking device, the time needed to make an ink spot is commonly in the range of 300 milliseconds. This amounts to about 1% of the time needed for all the testing and marking operations. Since the trend is towards differentiating between testing instruments and marking instruments, to the extent that the surface area of the circuits diminishes, the use of a laser enables the number of marking instruments to be reduced by three in relation to the number of testing instruments for the same output.

Now, the cost of a marking instrument is very high. It is in the range of some tens of thousands of francs. Laser marking therefore undeniably provides a saving by reducing the number of instruments needed to mark a given number of silicon wafers.

In an inking machine, to prevent deterioration of the quality of the ink deposited, the cartridges are changed whereas on an average there remains about 20% of ink in the cartridge.

On the basis of the following assumptions:

17,000 markings/day of circuits with a surface area of 1 $mm^2$, marking and testing done by five Xandex AS inking instruments using Xandex 6997 cartridges, and the replacement, on an average, of the cartridges every week and a cost per cartridge of 120 francs, the cost of the marking material (ink) is approximately 7,700 francs for 3 months.

To produce an equivalent marking, the laser lamp will be changed every three months and will cost only 1,200 francs.

Thus, the cost of the material used for the marking will be reduced by a factor of 7.

Furthermore, laser marking gives advantages as regards the total time taken for the marking operations, namely advantages in terms of productivity.

This is because:

a necessary step for the polymerization, in a furnace, of the deposited ink is eliminated, the replacement of an ink cartridge necessitates a number of mechanical setting operations due to the fact that the physical properties of the ink (such as viscosity and consistency) may vary from one cartridge to another.

The invention therefore provides a gain in productivity and savings and increased precision.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for physically marking, on a silicon wafer, a surface of an integrated circuit deemed to be defective during a testing step so as to modify a visual appearance of the surface, the method comprising steps of:

identifying a defective integrated circuit; and marking the defective integrated circuit at a plurality of locations by exposing the surface of the defective integrated circuit to laser radiation of sufficient magnitude such that the defective integrated circuit will not operate.

2. The method according to claim 1, wherein the integrated circuit includes a plurality of layers, and wherein the step of marking includes a step of melting at least a part of each of the plurality of layers.

3. The method according to claim 1 wherein the integrated circuit is covered with at least one passivation layer having a thickness, and wherein the step of marking includes a step of melting the surface of the defective integrated circuit to a depth greater than the thickness of the passivation layer.

4. The method according to claim 1, wherein energy density of the laser radiation at the surface of the defective integrated circuit is in the range of 200 to 1200 millijoules per square millimeter.

5. The method according to claim 1, wherein the laser radiation is focused in such a way that a marking diameter is variable.

6. The method according to claim 5, wherein the marking diameter is between 300 and 1000 micrometers.

7. The method of claim 1, wherein the step of marking includes a step of marking the surface of the defective integrated circuit at a plurality of locations in a predetermined geometric pattern.

8. A method of inspecting a plurality of integrated circuits on a silicon wafer, the method comprising steps of:

testing the plurality of integrated circuits;

identifying defective integrated circuits; and exposing a surface of each of the defective integrated circuits to laser radiation of sufficient magnitude such that the defective integrated circuit will not operate, the step of exposing including a step of creating a mark on the surface of each of the defective integrated circuits at a plurality of locations.

9. The method according to claim 8, wherein each of the integrated circuits includes a plurality of layers, and wherein the step of exposing includes a step of melting at least a part of each of the plurality of layers of each of the defective integrated circuits.

10. The method according to claim 8 wherein the integrated circuits are covered with at least one passivation layer having a thickness, and wherein the step of exposing includes a step of melting the surface of each of the defective integrated circuits to a depth greater than the thickness of the passivation layer.

11. The method according to claim 8, wherein the step of exposing includes a step of generating an energy density of the laser radiation at the surface of the defective integrated circuit is in the range of 200 to 1200 millijoules per square millimeter.

12. The method according to claim 8, wherein the mark has a mark diameter, and wherein the step of exposing includes a step of focusing the laser radiation to control the mark diameter.

13. The method according to claim 12, wherein the mark diameter is between 300 and 1000 micrometers.

14. The method of claim 8, wherein the step of marking includes a step of marking the surface of the defective integrated circuir at a plurality of locations in a predetermined geometric pattern.

\* \* \* \* \*

UNITED STATES PATENT AND TRADEMARK OFFICE
CERTIFICATE OF CORRECTION

PATENT NO.     : 6,559,409 B1
DATED          : May 6, 2003
INVENTOR(S)    : Bernard Cadet It is certified that error appears in the above-identified patent and that said Letters Patent is hereby corrected as shown below:

Column 10,
Lines 32 thru 35, Claim 14 should read as shown below:
-- 14. The method of claim 8, wherein the step of marking includes a step of marking the surface of the defective integrated circuit at a plurality of locations in a predetermined
geometric pattern. --

Signed and Sealed this

Twenty-sixth Day of August, 2003

JAMES E. ROGAN
*Director of the United States Patent and Trademark Office*